US008837121B2

(12) United States Patent
Yamamoto

(10) Patent No.: US 8,837,121 B2
(45) Date of Patent: Sep. 16, 2014

(54) HINGE MECHANISM AND IMAGE FORMING APPARATUS

(75) Inventor: Koyo Yamamoto, Nisshin (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 877 days.

(21) Appl. No.: 13/031,757

(22) Filed: Feb. 22, 2011

(65) Prior Publication Data

US 2011/0205692 A1 Aug. 25, 2011

(30) Foreign Application Priority Data

Feb. 23, 2010 (JP) ................................ 2010-037376

(51) Int. Cl.

*H05K 5/00* (2006.01)
*H05K 7/00* (2006.01)
*G11B 17/00* (2006.01)
*G03G 21/16* (2006.01)

(52) U.S. Cl.

CPC .... *G03G 21/1633* (2013.01); *G03G 2221/1687* (2013.01)

USPC ............ 361/679.01; 361/679.41; 361/679.42; 361/679.43; 361/679.44; 369/253

(58) Field of Classification Search

USPC ............. 361/679.01, 679.02, 679.08, 679.09, 361/679.3, 679.55–679.59; 369/282, 291, 369/253, 44.16, 75.5

See application file for complete search history.

(56) References Cited

U.S. PATENT DOCUMENTS

| | | | | |
|---|---|---|---|---|
| 4,663,803 A * | 5/1987 | Gora | ............................... | 16/266 |
| 7,452,145 B2 | 11/2008 | Kato | | |
| 2005/0281607 A1 | 12/2005 | Kato | | |

FOREIGN PATENT DOCUMENTS

| | | |
|---|---|---|
| CN | 1721197 A | 1/2006 |
| JP | 61-002321 Y2 | 1/1986 |
| JP | 62-200815 U | 12/1987 |
| JP | 06-299754 | 10/1994 |
| JP | 10-205522 | 8/1998 |
| JP | 2001-277654 A | 10/2001 |
| JP | 2006-203777 A | 8/2006 |

OTHER PUBLICATIONS

JP Office Action dtd Jan. 10, 2012, JP Appln. 2010-037376, English translation.

CN Office Action mailed Feb. 21, 2013, CN Appln. 201110054064.6, English Translation.

* cited by examiner

*Primary Examiner* — Jenny L Wagner
*Assistant Examiner* — Jerry Wu
(74) *Attorney, Agent, or Firm* — Banner & Witcoff, Ltd.

(57) ABSTRACT

A hinge mechanism, which connects a first member and a second member, comprising: a plurality of bases, a plurality of shafts, which are provided at the plurality of bases one by one, and protrude from the bases, a plurality of shaft receiving units, which are provided in the second member, and include shaft holes into which the shafts are rotatably fitted, respectively, and a regulating stopper, wherein when a force is applied at the regulating stopper, the regulating stopper is bent from a position where the regulating stopper contacts with a regulated unit to a position where the regulating stopper does not contact with the regulated unit.

9 Claims, 10 Drawing Sheets

HINGE MECHANISM AND IMAGE FORMING APPARATUS

CROSS REFERENCE TO RELATED APPLICATION

The present application claims priority from Japanese Patent Application No. 2010-037376, which was filed on Feb. 23, 2010, the disclosure of which is herein incorporated by reference in its entirety.

TECHNICAL FIELD

The present invention relates to a hinge mechanism which is configured to connect a first member to a second member and in which the second member swings relative to the first member, and to an image forming apparatus including the hinge mechanism.

BACKGROUND

For example, in a related art hinge mechanism, the separation of a shaft from a shaft receiving unit can be prevented by screwing a C-shaped ring to a supporting unit.

However, according to the related art hinge mechanism, as a screw process is required, it is difficult to reduce the number of the assembly processes. In view of the above, the object of the invention is to provide such a hinge mechanism that assembly work using working tools such as the screw process can be eliminated, and the object of the invention is to reduce the manufacturing costs of the image forming apparatus by using the hinge mechanism.

SUMMARY

According to a first illustrative aspect of the present invention, there is provided a hinge mechanism, which connects a first member and a second member that is configured to swing relative to the first member, the hinge mechanism comprising: a plurality of bases, which are provided at the first member, protrude from the first member in a first direction orthogonal to a swinging central axis and are discretely provided along the swinging central axis, a plurality of shafts, which are provided at the plurality of bases one by one, and protrude from the bases in a second direction parallel to the swinging central axis, a plurality of shaft receiving units, which are provided in the second member, and include shaft holes into which the shafts are rotatably fitted, respectively, and a regulating stopper that extends along the second direction of the shafts, an end portion of the regulating stopper is integrally formed with either of the first member and the second member, and the other end portion of the regulating stopper contacts a regulated unit provided at the other member of the first member and the second member, whereby a separation of the shaft receiving units from the shafts is regulated, wherein when a force in a third direction intersected with the second direction is applied at the other end portion of the regulating stopper, the other end portion of the regulating stopper is bent from a position where the other end portion of the regulating stopper contacts with the regulated unit to a position where the other end portion of the regulating stopper does not contact with the regulated unit. An swinging central axis is a virtual line passing through the swinging center of a hinge mechanism, and is a virtual line that is coincident with the central axis of a shaft and a shaft hole.

Therefore, in the invention, for example, when a second member is to be assembled into a first member, a force is applied on the other end portion of a cantilever-shaped regulating stopper, the regulating stopper is bent, and the other end portion is displaced from a position where the other end portion can contact with a regulated unit to a position away from the regulated unit. In this way, the shaft can be assembled to the shaft receiving unit. Therefore, An assembly work can be finished without conducting the assembly work using working tools such as a screw.

In this case, in the invention, as all the plurality of shafts protrude in the same direction, if the second member is relatively moved in a direction opposed to the protruding direction of the first member, the fitting of all the shafts into all the shaft holes corresponding to the shafts can be finished in one work, and thus the assembly process can be significantly reduced.

In addition, when the shaft receiving unit is to be separated from the shaft, it is necessary for the shaft receiving unit to displace relatively in a direction parallel to the protruding direction of the shaft (central axis direction). However, when the other end portion of the regulating stopper contacts (collide with) the regulated unit, and the displacement of the shaft receiving unit is regulated, a force whose direction is parallel to the longitudinal direction (hereinafter the force is called separation force) acts on the regulating stopper.

When an external force parallel to the longitudinal direction acts on a beam-like member, the member is extended or compressed. When an external force orthogonal to the longitudinal direction acts on the beam-like member, the member is bent. Thus, when the same force acts on the member, generally, for the displacement amount of the site on which the external force acts, the displacement amount formed by the bending deformation is larger compared to the displacement amount formed by the extending deformation or the compressing deformation.

Therefore, in the invention, even if the assembly force is small, the other end portion of the regulating stopper can be easily displaced from a position where the other end portion can contact with the regulated unit to an uncontacted position. Meanwhile, even if the separation force which is identical to the assembly force acts on the other end portion of the regulating stopper, the other end portion of the regulating stopper is not displaced to such an extent that the shaft receiving unit is separated from the shaft.

Therefore, in the invention, at the time of assembly, the first member can be easily assembled with the second member without using working tools such as a screw. After the assembly, the shaft receiving unit can be prevented from easily separating from the shaft.

In addition, in the invention, as the shaft is discretely provided along the swinging central axis, even if a large external force acts on the first member or the second member, the external force can be discretely borne, and the damage to the hinge mechanism can be prevented.

The invention is not limited to the specific unit described above.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE PRESENT INVENTION

In the embodiments, the hinge mechanisms according to the invention are provided in the image forming apparatus and the embodiments of the invention are described below together with the drawings.

The First Embodiment

1. The Summary of the Image Forming Apparatus

Figure 1:
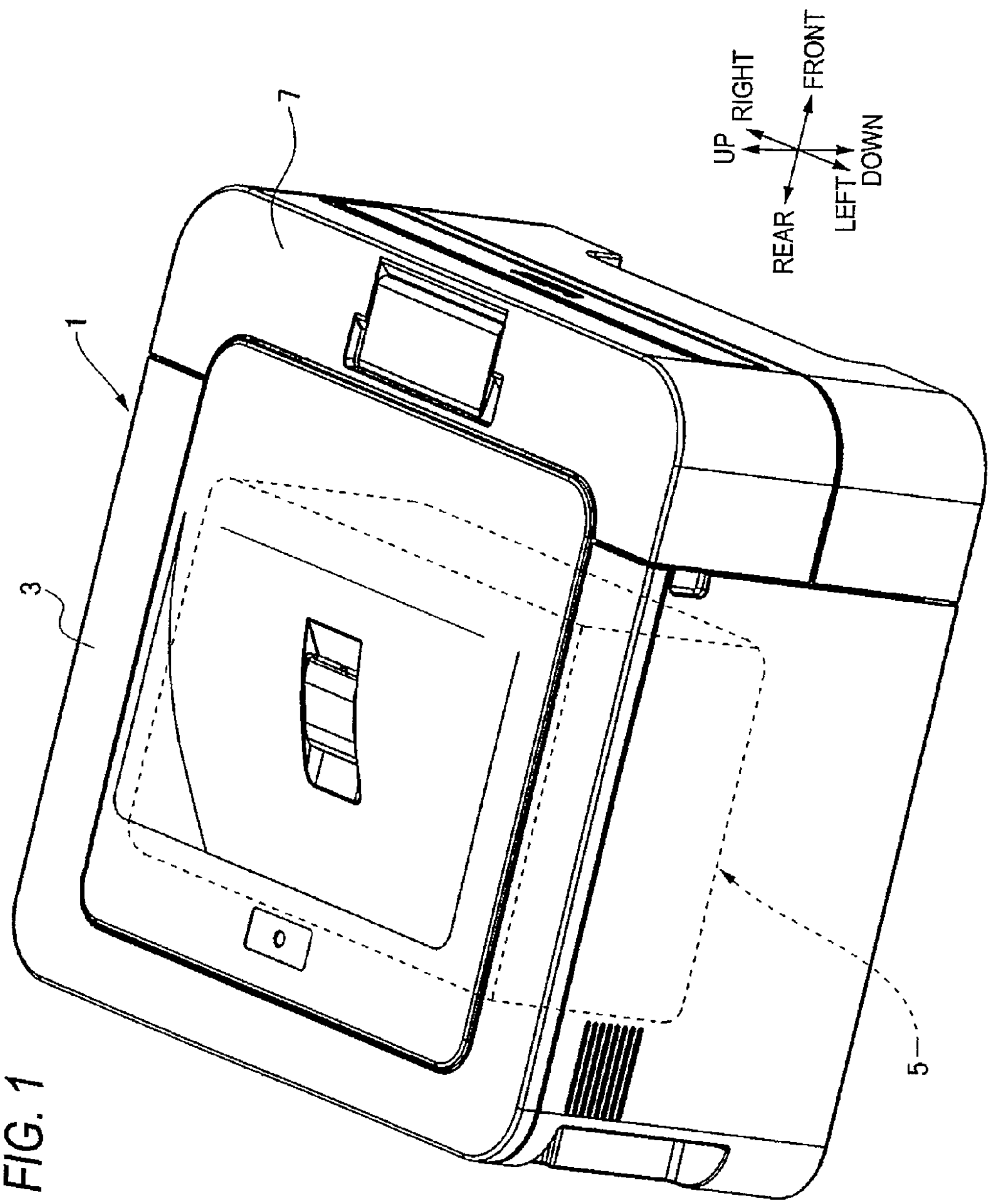
FIG. 1 is a perspective view of an image forming apparatus 1 according to an embodiment of the invention.

As shown in FIG. 1, in the image forming apparatus 1 according to the embodiment, an image forming unit 5, which forms images on sheets or OHP sheets (hereinafter called sheets), is housed in an main body 3 having designed appearance. A cover 7, by which an opening 3A (see FIG. 2) provided in the main body is opened and closed, is provided in the front of the main body 3.

In addition, the image forming unit 5 according to the embodiment is an electro-photographic image forming unit that forms images on sheets by transferring developers on the sheets. When the sheets are jammed around the image forming unit 5 or on the sheet conveying path, the opening 3A is opened to remove the jammed sheets.

Figure 2:
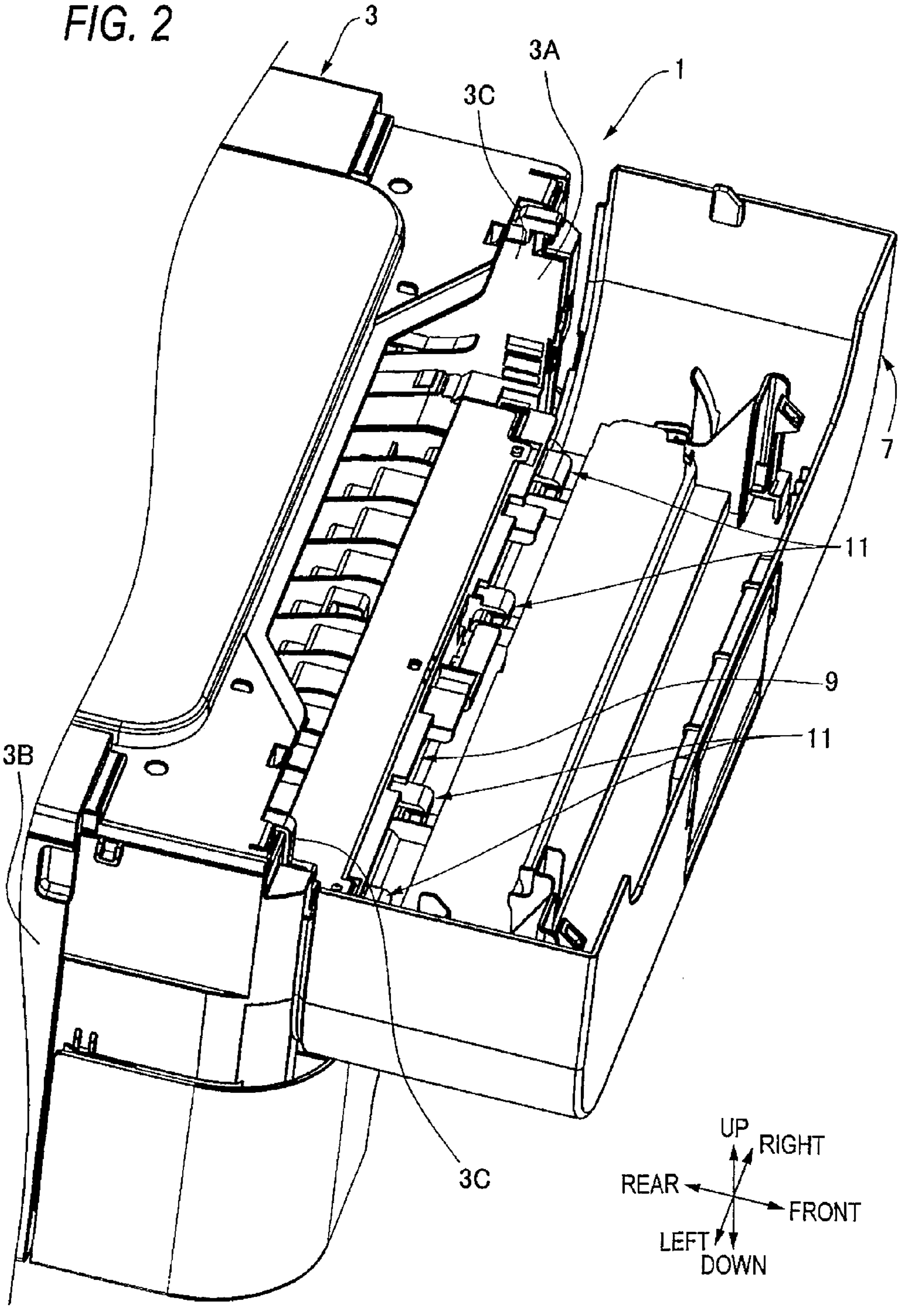
FIG. 2 is a drawing showing that a cover 7 is opened in the image forming apparatus 1 according to the embodiment of the invention.

In addition, as shown in FIG. 2, the main body 3 includes a cover 3B having designed appearance, and side frames 3C that are provided at the inside of the cover 3B and act as strength members (skeleton). The side frames 3C are arranged at both sides of the image forming unit 5 and the sheet conveying path to hold the image forming unit 5 in horizontal direction.

Thus, the cover 7 is swingablly assembled to the main body 3 by a hinge frame 9. The hinge frame 9 extends along a direction orthogonal to the sheet conveying direction (in the embodiment, horizontal direction) and is secured to a pair of side frames 3C to cross the sheet conveying path.

2. Hinge Mechanism

As shown in FIG. 2, the hinge mechanism 11 is swingablly connected to the main body 3 (hinge frame 9) and the cover 7. The hinge mechanism 11 is provided at the internal side of the cover 7.

Figure 3:
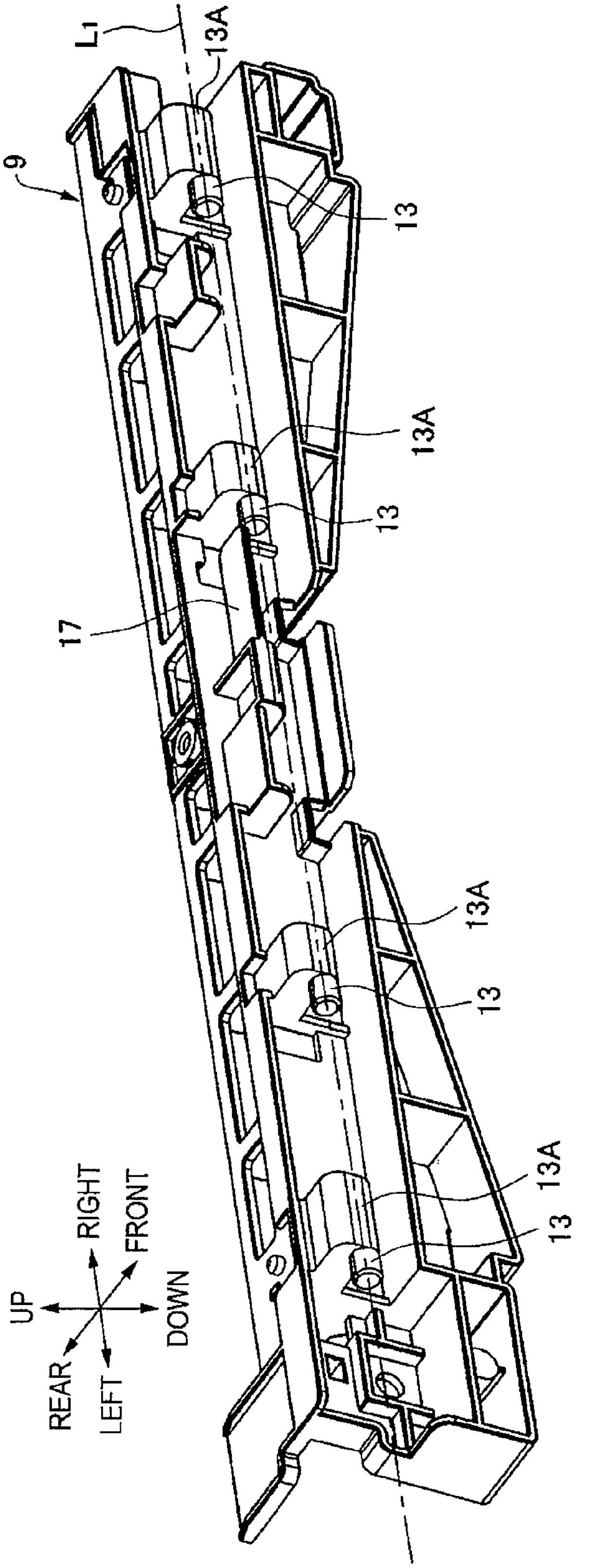
FIG. 3 is a perspective view of a hinge frame 9 according to a first embodiment of the invention.
Figure 6:
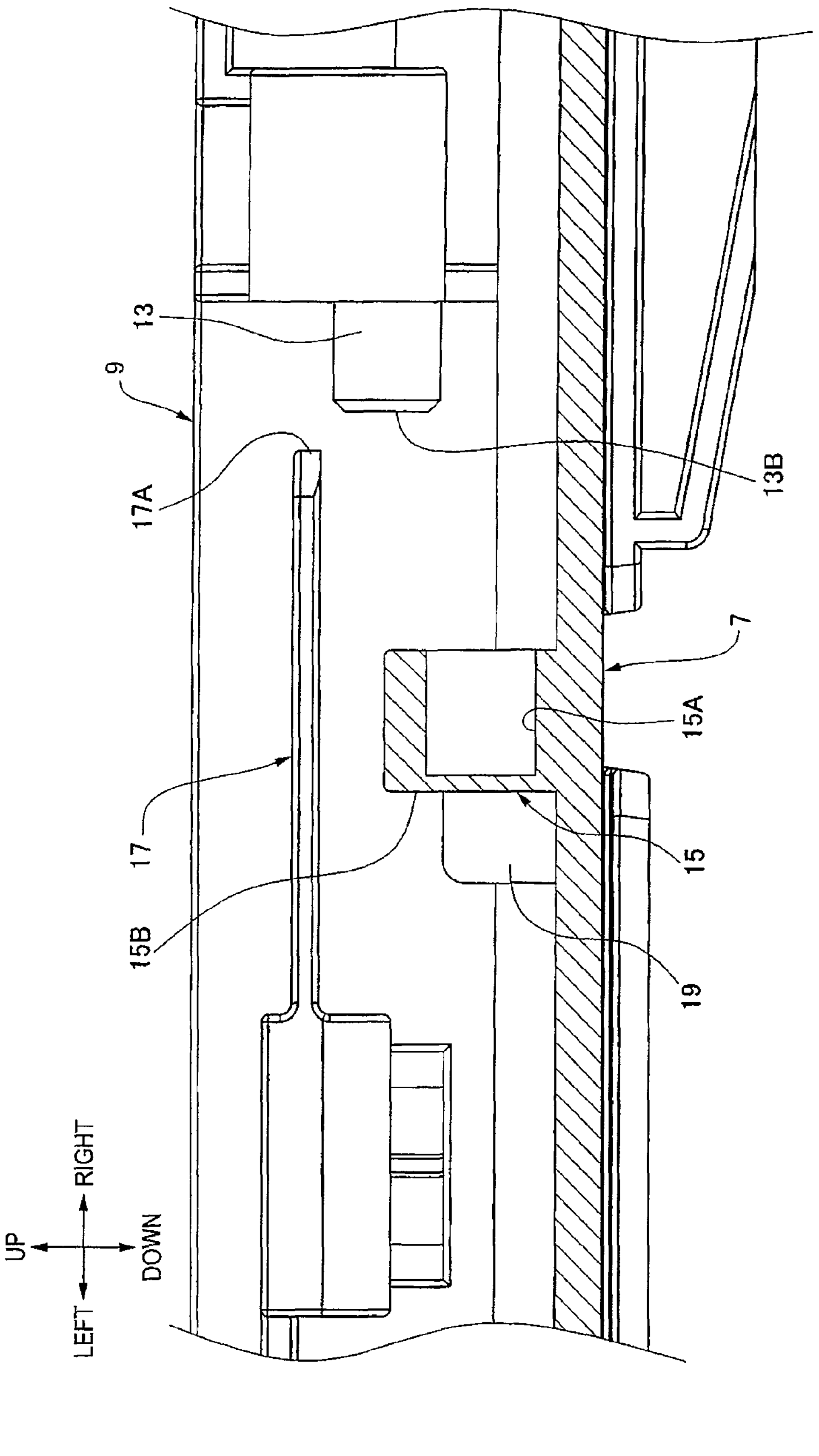
FIG. 6 is a drawing showing a state that the cover 7 has not been installed to the hinge frame 9.

Thus, as shown in FIG. 3 and FIG. 6, the hinge mechanism 11 according to the embodiment includes a plurality of shafts 13 (see FIG. 3) provided at the hinge frame 9, and a plurality of shaft receiving units 15 (see FIG. 6) provided at the cover 7.

In addition, as shown in FIG. 6, shaft holes 15A into which the shafts 13 are rotatably fitted are provided in the shaft receiving units 15. By sliding and rotating the shafts 13 relative to the shaft holes 15A (shaft receiving units 15), the cover 7 can be swingablly displaced relative to the hinge frame 9 (main body 3).

On the other hand, as shown in FIG. 3, each of a plurality of bases 13A is integrally formed one by one. These bases 13A protrude from the hinge frame 9 to a direction orthogonal to the swinging central axis L1, and are protrusions that are discretely and integrally formed at the hinge frame 9 along the swinging central axis L1.

The swinging central axis L1 is a virtual swinging central line when the cover 7 is swung against the hinge frame 9. The swinging central axis L1 according to the embodiment is coincident with the axis of the shaft holes 15A and the shafts 13, and is a virtual line extending in horizontal direction.

Figure 5:
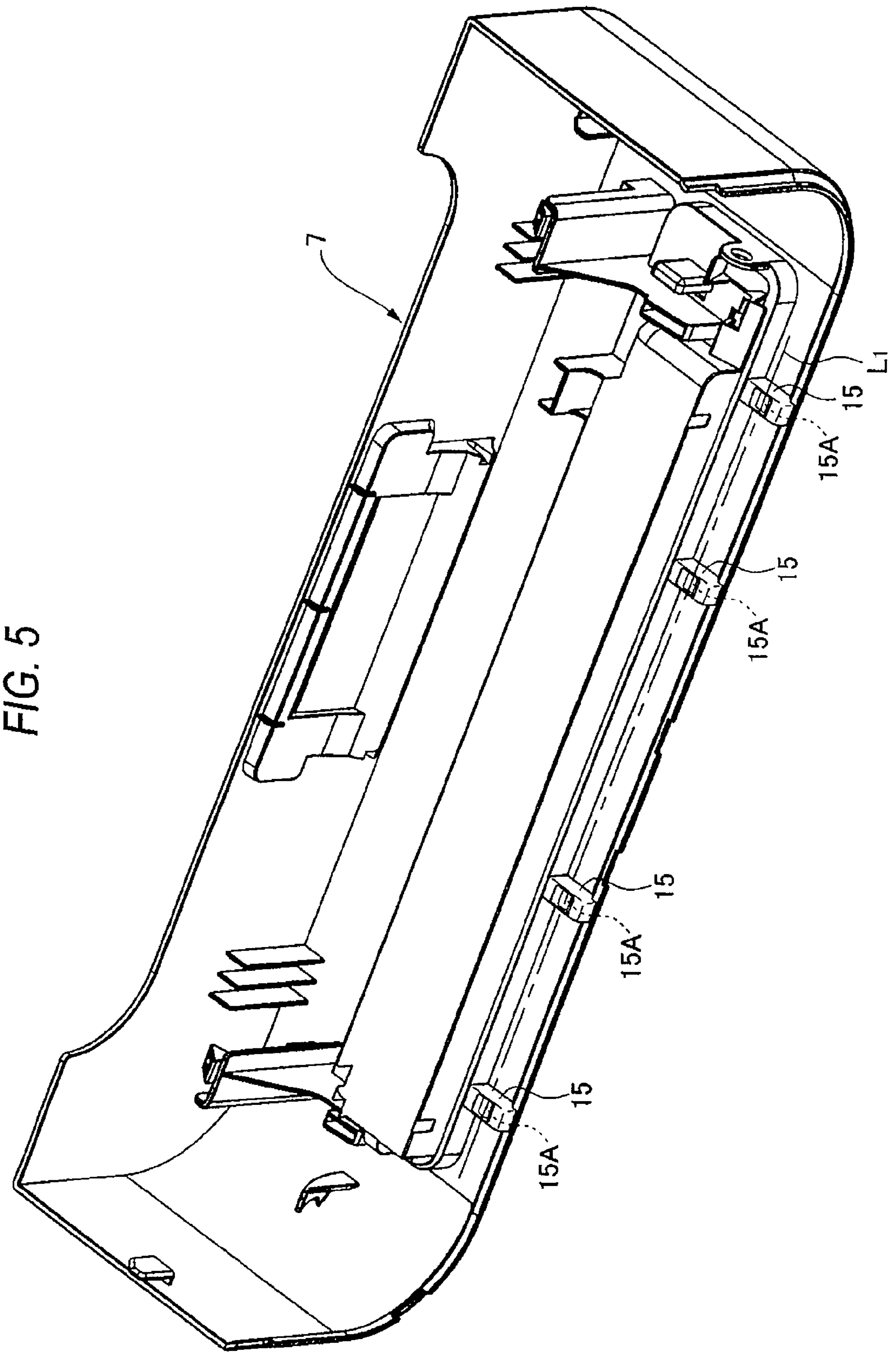
FIG. 5 is a perspective view of the cover 7 according to the embodiment of the invention.

In addition, each of the plurality of shafts 13 protrudes from the base 13A to a direction (in the embodiment, the horizontal direction) coincident with the swinging central axis L1. On the other hand, as shown in FIG. 6, for the plurality of shaft holes 15A, one end of each of the plurality of shaft hole 15A is open in the axial direction (an end opposed to the protruding direction of the shafts 13), while the other end is closed. As shown in FIG. 5, the plurality of shaft holes 15A are discretely provided at the cover 7 along the swinging central axis L1.

Figure 4:
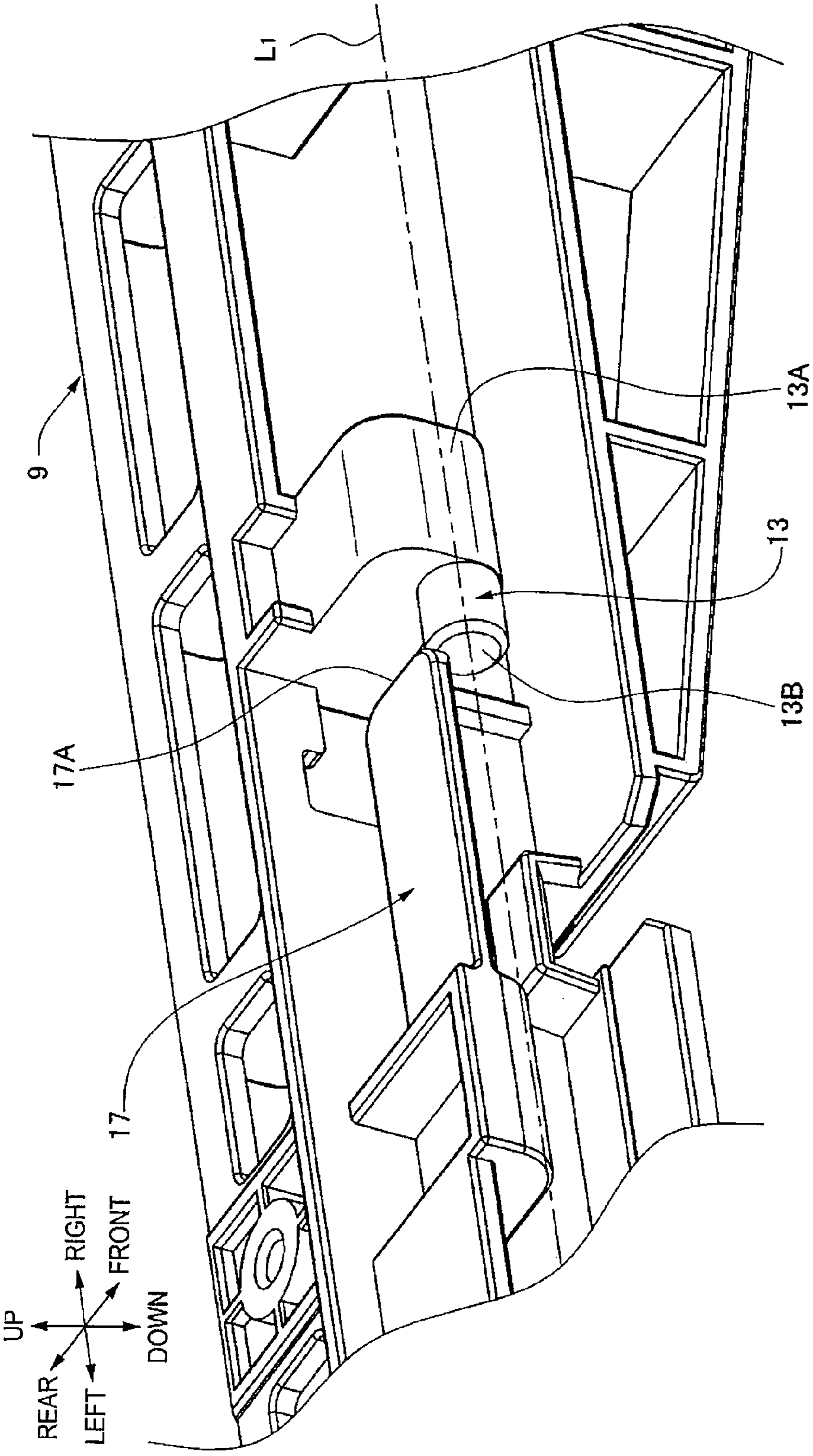
FIG. 4 is an enlarged view of a regulating stopper 17 in FIG. 3.
Figure 8:
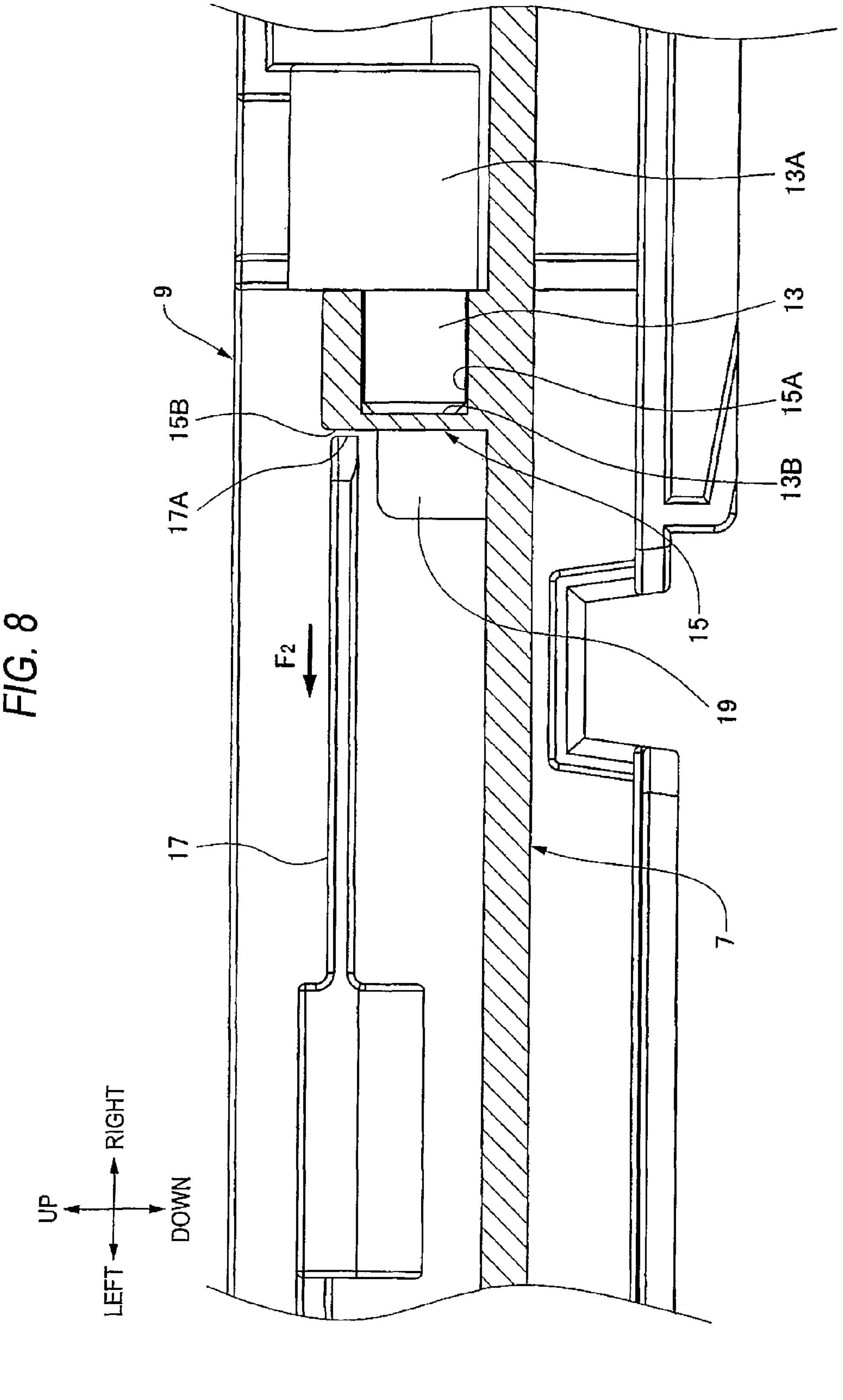
FIG. 8 is a drawing showing a state that the cover 7 has been installed to the hinge frame 9.

In addition, as shown in FIG. 8, when the shaft 13 is fitted into the shaft hole 15A, a regulating stopper 17 is provided in the hinge frame 9 to regulate the separation of the shaft receiving unit 15 from the shaft 13. As shown in FIG. 4, one end of the regulating stopper 17 is integrated into the hinge frame 9, and the regulating end 17A is a plate spring extending along the swinging central axis L1 in a direction opposed to the protruding direction of the shaft 13. In the following, the other end of the regulating stopper 17 is called a regulating end 17A.

In other words, the regulating stopper 17 is integrally formed by resins together with the hinge frame 9, and the regulating end 17A extends toward the front end 13B of the shaft 13. On the other hand, as shown in FIG. 8, a regulated unit 15B is set at a site, which is the axial end of the shaft receiving unit 15 and is opposed to the regulating end 17A, to contact the regulating end 17A of the regulating stopper 17A.

Thus, when the shaft 13 is fitted into the shaft hole 15A, by contacting the regulated unit 15B set at the shaft receiving unit 15 with the regulating stopper 17, the separation of the shaft receiving unit 15 from the shaft 13 is prevented.

In addition, when the shaft receiving unit 15 (cover 7) displaces toward the base 13A, by contacting the front end 13B of the shaft 13 with the bottom of the shaft hole 15A, or by contacting the base 13A with the outer edge of the inlet of the shaft hole 15A, the position of the shaft receiving unit 15 relative to the shaft 13 is regulated.

Figure 7:
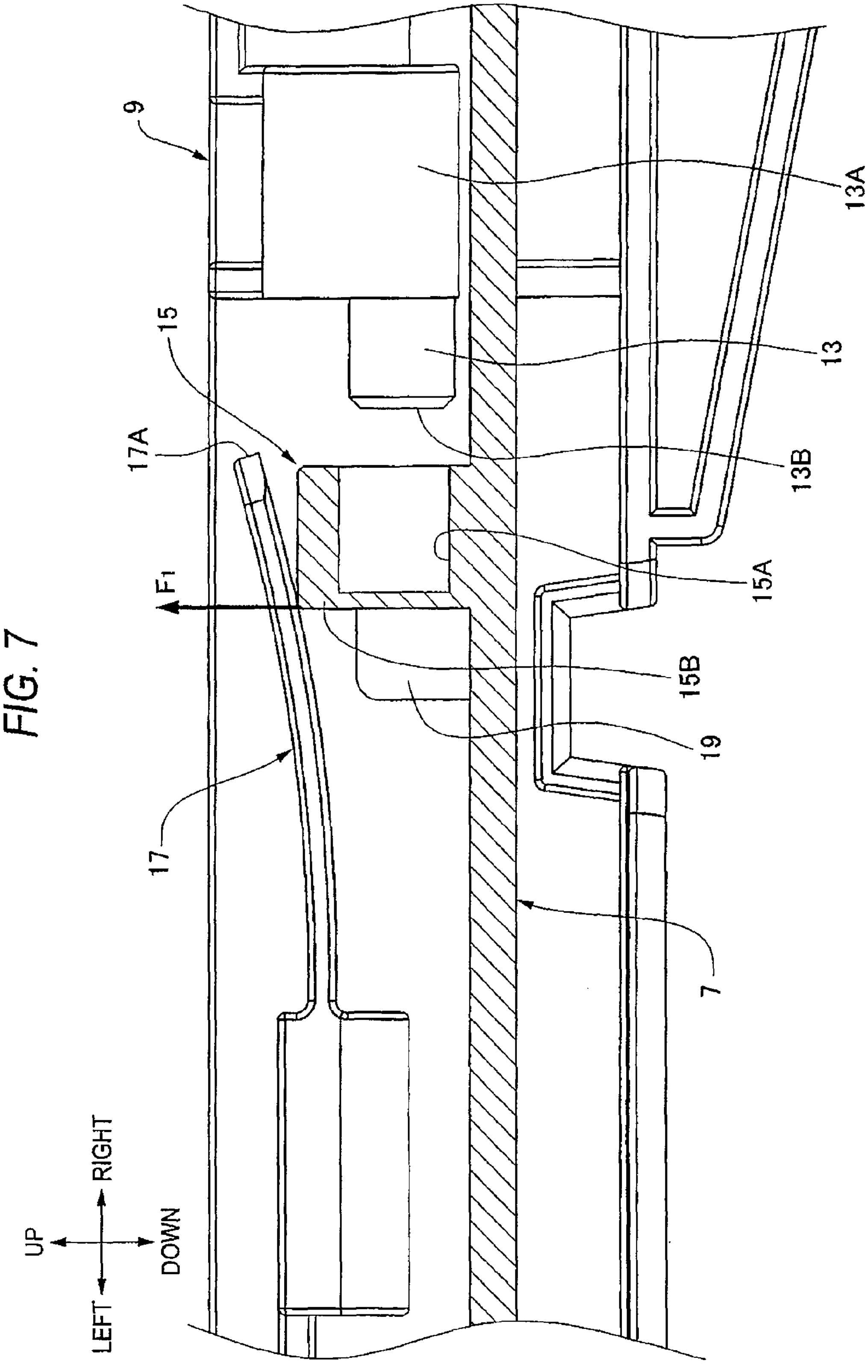
FIG. 7 is a drawing showing that the cover 7 is being installed to the hinge frame 9.

In addition, as shown in FIG. 7, when a force (hereinafter the force is called assembly force F1) the direction of which is intersected with the protruding direction of the shaft 13 (a direction parallel to the swinging central axis L1) is received at the regulating end 17A, the regulating stopper 17 is set to have such stiffness that the regulating end 17A can be bent from a position where the regulating end 17 can contact with the regulated unit 15B to an uncontacted position.

In addition, although the directions intersected with the assembly force F1 may be the directions intersected with the protruding direction of the shaft 13, the direction intersected with the protruding direction in the embodiment is such a direction that the greatest geometrical moment of inertia among the geometrical moments of inertia, which are related to cross sections orthogonal to the extending direction of the regulating stopper 17, becomes small.

In other words, the direction intersected with the protruding direction in the embodiment is such a possible direction (in FIG. 7, the vertical direction) in which the regulating stopper 17 is bent from a position where the regulating end 17A can contact with the regulated unit 15B to an uncontacted position, and the regulating stopper 17 can be easily bent.

Thus, as shown in FIG. 6, before the regulating stopper 17 is bent, that is, before the assembly force F1 acts on the regulating stopper 17, the regulating end 17A is set to be located at a position away from a position opposed to the front end 13B of the shaft 13 in the direction of the assembly force (in FIG. 6, upwards).

In addition, as shown in FIG. 8, a deflection preventing unit 19 is provided near the regulated unit 15B of the cover 7 to prevent the deflecting displacement of the regulating stopper 17 from going beyond a predetermined position by colliding with the regulating stopper 17 when the regulating end 17A of the regulating stopper 17 is deflected in a direction opposed to the direction of the assembly force (in FIG. 8, downwards).

3. The Assembly of the Cover into the Hinge Frame and the Features of the Hinge Mechanism According to the Embodiment In the embodiment, when the cover 7 is to be assembled into the hinge frame 9, the assembly force F1 acts on the regulating end 17A of the cantilever-shaped regulating stopper 17 and the regulating stopper 17 is bent. As shown in FIG. 7, when the regulating end 17A is displaced from a position where the regulating end 17A can contact with the regulated unit 15B to an uncontacted position, the shaft 13 can be assembled into the shaft receiving unit 15. Therefore, the assembly work can be finished without using working tools such as a screw.

In this case, in the embodiment, as all the plurality of shafts 13 protrude to the same direction, if the cover 7 is moved relative to the hinge frame 9 in a direction opposed to the protruding direction, the fit of all the shafts 13 into all the corresponding shaft holes 15A can be finished in one work, and the number of the assembly processes can be significantly reduced.

In addition, when the shaft receiving unit 15 is to be separated from the shaft 13, as shown in FIG. 8, it is necessary for the shaft receiving unit 15 to displace relative to the shaft 13 in a direction opposed to the protruding direction of the shaft 13 which is a direction parallel to the swinging central axis L1. However, when the regulating end 17A of the regulating stopper 17 contacts (collide with) the regulated unit 15B and the displacement of the shaft receiving unit 15 is regulated, a force parallel to the longitudinal direction (hereinafter the force is called separation force F2) acts on the regulating stopper 17.

When an external force parallel to the longitudinal direction acts on the beam-like member, the member is extended or compressed. When an external force orthogonal to the longitudinal direction acts on the beam-like member, the member is bent. Thus, when the same force acts on the member, generally, for the displacement amount of the site on which the external force acts, the displacement amount formed by the bending deformation is larger compared to the displacement amount formed by the extending deformation or the compressing deformation.

Therefore, even if the assembly force F1 is small, the regulating end 17A of the regulating stopper 17 can be easily displaced from a position where the regulating end 17A can contact with the regulated unit 15B to an uncontacted position. Meanwhile, even if the separation force F2 which is identical to the assembly force F1 acts on the regulating end 17A of the regulating stopper 17, the regulating end 17A of the regulating stopper 17 will not be displaced to such an extent that the shaft receiving unit 15 is separated from the shaft 13.

Therefore, in the embodiment, at the time of assembly, the first member 9 can be easily assembled with the second member 7 without using working tools such as a screw. After the assembly, the shaft receiving unit 15 can be prevented from easily separating from the shaft 13.

In addition, in the invention, as the shafts 13 are discretely provided along the swinging central axis L1, even if a large external force acts on the hinge frame 9 or the cover 7, the external force can be discretely borne, and the damage to the hinge mechanism 11 can be prevented.

It is enough for the regulated member 15B and the regulating stopper 17 to be provided as different members. However, in the embodiment, as one end of the regulating stopper 17 is integrated into the hinge frame 9, the regulating end 17A extends toward the front end 13B of the shaft 13, and the regulated unit 15B is provided in the axial end of the shaft receiving unit 15, the configuration of the hinge mechanism 11 can be simplified, and the manufacturing costs of the hinge mechanism 11 can be reduced.

In addition, in the embodiment, as the regulating end 17A of the regulating stopper 17 is displaced from a position opposed to the front end 13B of the shaft 13 to an uncontacted position in the direction of the assembly force F1, the necessary displacement amount of the regulating stopper 17 (regulating end 17A) to assemble the hinge frame 9 and the cover 7 can be reduced. Therefore, the bending stress produced in the regulating stopper 17 can be reduced, and the durability of the regulating stopper 17 can be improved.

In addition, in the embodiment, as the deflection preventing unit 19 is provided to prevent the deflecting displacement of the regulating end 17A of the regulating stopper 17 from going beyond a predetermined position in a direction opposed to the direction of the assembly force, excessive bending stress to the regulating stopper 17 can be prevented in advance, and the durability of the regulating stopper 17 can be improved.

In addition, in the embodiment, as shown in FIG. 7, when the hinge frame 9 is assembled with the cover 7, the shaft receiving unit 15 contacts the regulating end 17A of the regulating stopper 17 and the assembly force F1 acts on the regulating stopper 17. Thus, at the time of assembly, in order to displace the regulating end 17A of the regulating stopper 17 displace, it is not necessary to act the assembly force F1 on the regulating end 17A separately, but the assembly force F1 can act on the regulating stopper 17 when the fitting of the shaft 13 to the shaft receiving unit 15 is conducted, and the assembly work can be improved.

In addition, in the embodiment, as the shafts 13, the bases 13A and the regulating stopper 17 are integrally formed by resins together with the hinge frame 9, the manufacture costs of the hinge mechanism 11 can be reduced.

In addition, in the embodiment, as the manufacture costs of the hinge mechanism 11 can be reduced, the manufacture costs of the image forming apparatus 1 can be reduced. Furthermore, in the embodiment, as the hinge mechanism 11 is provided at the internal side of the cover 7, the damage to the appearance design (beauty) of the image forming apparatus can be prevented, and users can be prevented from accidentally touching the hinge mechanism 11 (especially, the regulating stopper 17).

4. Correspondence Relationship Between the Specific Items of the Invention and the Embodiments In the embodiment, the hinge frame 9 (main body 3) corresponds to the first member recorded in the claims, the cover 7 corresponds to the second member recorded in the claims, and the regulating end 17A corresponds to the other end of the regulating stopper 17 recorded in the claims.

The Second Embodiment

Figure 9:
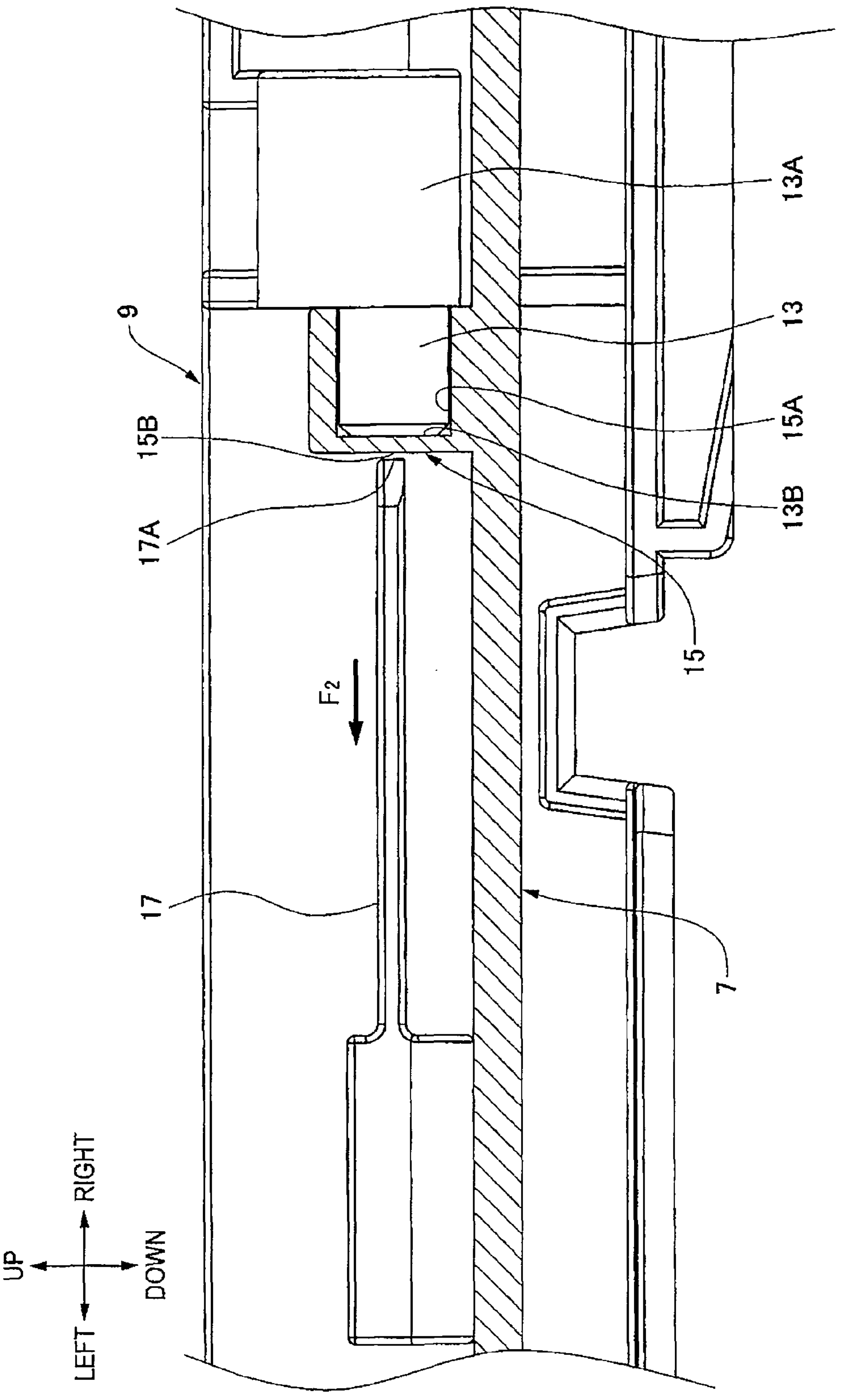
FIG. 9 is a drawing showing the features of the hinge mechanism 11 according to a second embodiment of the invention.

In the above embodiment, the regulating end 17A of the regulating stopper 17 is located at a position away from a position opposed to the front end 13B of the shaft 13 in the direction of the assembly force F1. However, in this embodiment, as shown in FIG. 9, the regulating stopper 17 is set to arrange the regulating end 17A of the regulating stopper 17 to be opposed to the front end 13B of the shaft 13.

Therefore, in the embodiment, as the separation force F2 can be effectively borne by the regulating stopper 17, the separation of the shaft receiving unit 15 from the shaft 13 can be certainly prevented.

The Third Embodiment

Figure 10:
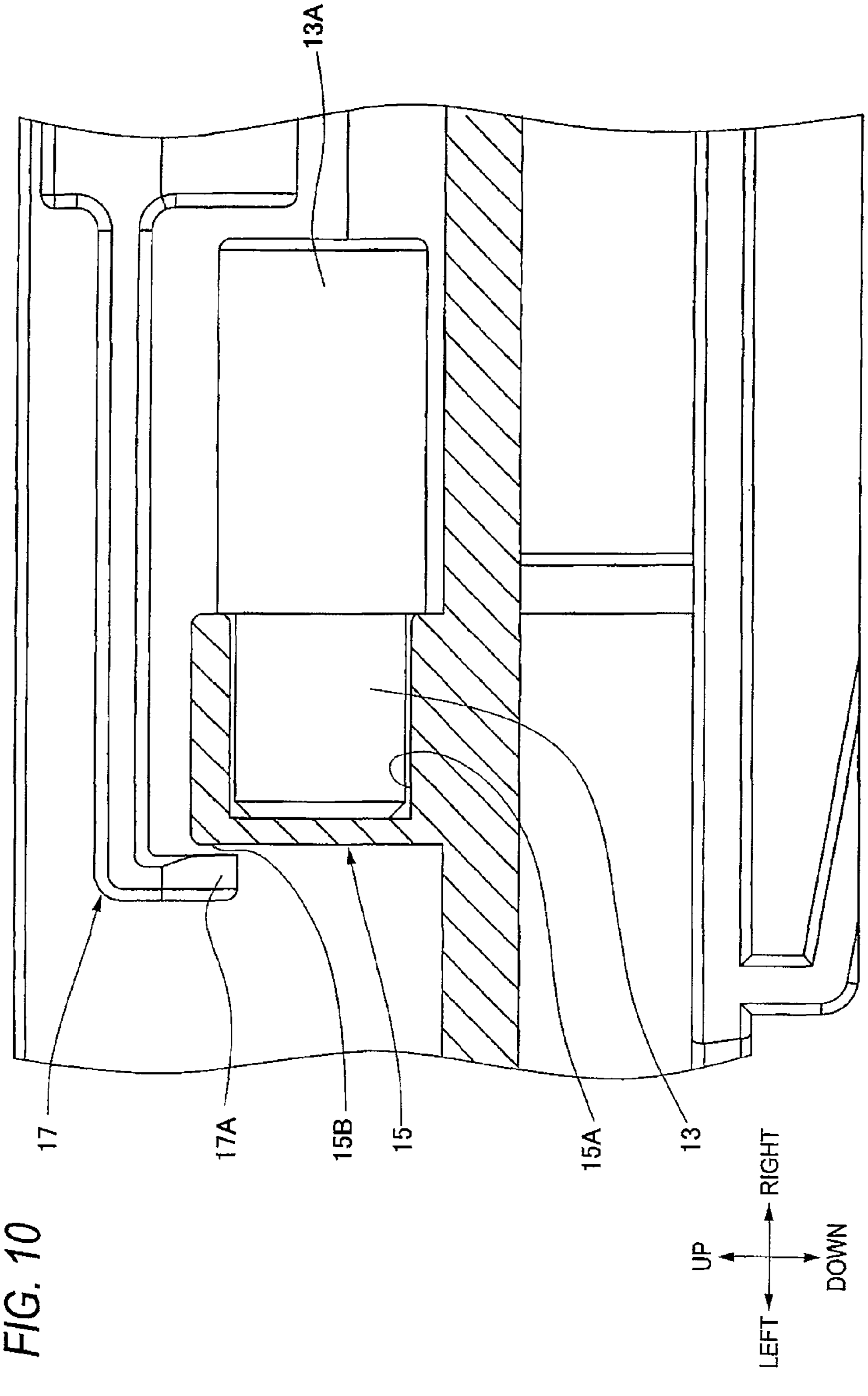
FIG. 10 is a drawing showing the features of the hinge mechanism 11 according to a third embodiment of the invention.

In the above embodiments, the fixed end of the regulating stopper 17 at the hinge frame 9 is provided at the side opposed to the base 13 to hold the regulating end 17A. However, in this embodiment, as shown in FIG. 10, the fixed end of the regulating stopper 17 is set at the same side as the base 13A relative to the regulating end 17A.

Other Embodiments

In the above embodiments, although the shaft 13 is provided at the hinge frame 9 (main body 3), and the shaft receiving unit 15 is provided at the cover 7, the invention is not limited to this. In contrast, the shaft 13 can be provided at the cover 7, and the shaft receiving unit 15 can be provided at the hinge frame 9 (main body 3).

In addition, in the embodiment, although the regulating stopper 17 is a plate, the invention is not limited to this. For example, the regulating stopper 17 can be a rod. In addition, when the cross section of the regulating stopper 17 is circular, the geometrical moments of inertia, which are related to the cross section orthogonal to the extending direction of the regulating stopper 17, are identical in any directions. In this case, the direction of the assembly force F1 may be any directions that are intersected with the protruding direction (the extending direction of the regulating stopper 17).

In addition, in the above embodiments, when the hinge frame 9 is assembled with the cover 7, although the shaft receiving unit 15 contacts the regulating end 17A of the regulating stopper 17 and the assembly force F1 acts on the regulating stopper 17, the invention is not limited to this. For example, when the assembly workers make the regulating stopper 17 displace in the direction of the assembly force F1, the shaft 13 can be inserted into the shaft holes 15A.

In addition, in the above embodiments, only one regulating stopper 17 is provided in the substantial center in the swinging central axial direction, but the invention is not limited to this. For example, the regulating stopper 17 can be provided on each side of the swinging central axial direction one by one. In addition, as long as the invention matches with the spirit of the invention recorded in the claims, the invention is not limited to the above embodiments.

What is claimed is:

1. A hinge mechanism, which connects a first member and a second member that is configured to swing relative to the first member, the hinge mechanism comprising:

a plurality of bases, which are provided at the first member, protrude from the first member in a first direction orthogonal to a swinging central axis and are discretely provided along the swinging central axis, a plurality of shafts, which are provided at the plurality of bases one by one, and protrude from the bases in a second direction parallel to the swinging central axis, a plurality of shaft receiving units, which are provided in the second member, and include shaft holes into which the shafts are rotatably fitted, respectively, and a regulating stopper that extends along the second direction of the shafts, an end portion of the regulating stopper is integrally formed with either of the first member and the second member, and the other end portion of the regulating stopper contacts a regulated unit provided at the other member of the first member and the second member, whereby a separation of the shaft receiving units from the shafts is regulated, wherein when a force in a third direction intersected with the second direction is applied at the other end portion of the regulating stopper, the other end portion of the regulating stopper is bent from a position where the other end portion of the regulating stopper contacts with the regulated unit to a position where the other end portion of the regulating stopper does not contact with the regulated unit.

2. The hinge mechanism according to claim 1, wherein the end portion of the regulating stopper is integrally formed with the first member, and the other end portion of the regulating stopper extends toward a front end of one of the shafts, and the regulated unit is provided at a surface of one of the shafts receiving unit which is opposite to a surface in which one of the shafts hole is formed.

3. The hinge mechanism according to claim 2, wherein the other end portion of the regulating stopper is arranged to face to the front end of one of the shafts.

4. The hinge mechanism according to claim 2, wherein the other end portion of the regulating stopper is displaced from a position in which the other end portion of the regulating stopper faces to the front end of one of the shafts in the third direction.

5. The hinge mechanism according to claim 1, wherein a deflection preventing unit is provided to prevent a deflecting displacement of the other end portion of the regulating stopper from going beyond a predetermined range in a fourth direction opposite to the third direction.

6. The hinge mechanism according to claim 1, wherein when the first member is assembled with the second member, the force is applied on the regulating stopper by contacting the shaft receiving unit with the other end portion of the regulating stopper.

7. The hinge mechanism according to claim 1, wherein the shafts, the bases and the regulating stopper are integrally formed by resins in the first member.

8. An image forming apparatus, comprising:

an image forming unit that forms images on a sheet, a main body that houses the image forming unit therein, a cover by which an opening provided at the main body is opened and closed, and the hinge mechanism according to claim 1 to connect the main body and the cover such that the cover swings relative to the main body.

9. The image forming apparatus according to claim 8, wherein the hinge mechanism is provided at an internal portion of the cover.

* * * * *